United States Patent
Putter

(10) Patent No.: US 8,742,788 B2
(45) Date of Patent: Jun. 3, 2014

(54) COMMON MODE VOLTAGE CONTROL

(75) Inventor: Bas Maria Putter, Adliswil (CH)

(73) Assignee: ST-Ericsson SA, Plan-les-Ouates (CH)

( * ) Notice: Subject to any disclaimer, the term of this patent is extended or adjusted under 35 U.S.C. 154(b) by 0 days.

(21) Appl. No.: 13/379,100

(22) PCT Filed: Jun. 18, 2010

(86) PCT No.: PCT/EP2010/003693
§ 371 (c)(1),
(2), (4) Date: Feb. 27, 2012

(87) PCT Pub. No.: WO2010/145837
PCT Pub. Date: Dec. 23, 2010

(65) Prior Publication Data
US 2012/0139610 A1 Jun. 7, 2012

(30) Foreign Application Priority Data
Jun. 19, 2009 (EP) .................................... 09251607

(51) Int. Cl.
*H03K 17/16* (2006.01)
*H03K 19/23* (2006.01)
*H03F 3/45* (2006.01)

(52) U.S. Cl.
USPC .............. 326/21; 330/260; 330/258; 326/104

(58) Field of Classification Search
USPC ......... 326/21, 31, 82, 104; 330/260, 258, 253
See application file for complete search history.

(56) References Cited

U.S. PATENT DOCUMENTS

| 5,914,638 | A | 6/1999 | He | |
|---|---|---|---|---|
| 7,746,171 | B2 * | 6/2010 | Ali | 330/259 |
| 8,055,233 | B2 * | 11/2011 | Hsieh et al. | 455/293 |
| 2002/0011900 | A1 | 1/2002 | Baschirotto et al. | |
| 2004/0239425 | A1 * | 12/2004 | Kudo et al. | 330/258 |
| 2009/0115523 | A1 | 5/2009 | Akizuki et al. | |

OTHER PUBLICATIONS

Baeg, S. et al., "Analytical Test Buffer Design for Differential Signaling I/O Buffers by Error Syndrome Analysis", IEEE Transactions on Very Large Scale Integration (VLSI) Systems, IEEE Service Center, Piscataway, NJ, US, vol. 13, No. 3, Mar. 1, 2005, pp. 370-383, XP011127851, ISSN: 1063-8210, *abstract; Fig. 8.

* cited by examiner

*Primary Examiner* — Daniel D Chang
(74) *Attorney, Agent, or Firm* — Coats & Bennett, P.L.L.C.

(57) ABSTRACT

A common mode control circuit (400) for generating a control signal indicative of a common mode signal in first and second signals of a differential signal pair comprises a first charge control means (300) for varying, dependent on polarity of the first and second signals with respect to a threshold, charge on a capacitive element (250, 260, 270). The first charge control means (300) is operable to, in response to the first and second signals both switching polarity simultaneously from opposite polarities, maintain a direction of flow of the charge. The first charge control means (300) can be operable to, in response to the first and second signals both switching polarity simultaneously from opposite polarities and the flow of charge being zero, maintain the flow at zero.

10 Claims, 7 Drawing Sheets

COMMON MODE VOLTAGE CONTROL

FIELD OF THE DISCLOSURE

The disclosure relates to a common mode control circuit for, and a method of, generating a control voltage indicative of a common mode voltage in first and second signals of a differential signal pair, and has application in, for example, analogue electronic circuits and digital electronic circuits.

BACKGROUND TO THE DISCLOSURE

Differential signals are commonly used in electronic circuits as they enable improved noise immunity over single ended signals. In circuits using dual polarity power supplies, differential signals are typically complementary positive and negative signals which are sent over separate signal paths. Information is conveyed as the voltage difference between the complementary signals. The sum of the complementary signals is nominally zero, but a non-zero sum can arise due to circuit imperfections, and this can cause errors to be introduced into the information. The term "common mode voltage" is conventionally applied to half of the sum of the complementary signals, this signal component being common to both of the complementary signals.

In circuits using a single polarity power supply, differential signals vary in a complementary manner about a threshold which is typically half way between the voltage $V_{dd}$ of the power supply voltage and zero or ground, that is $V_{dd}/2$. Information is similarly conveyed as the voltage difference between the complementary signals, but in this case the sum of the complementary signals is nominally $V_{dd}$. Half of any deviation from this nominal value is conventionally referred to as the common mode voltage.

The sum of the complementary signals is therefore indicative of the magnitude of the common mode voltage. The presence of a non-zero common mode voltage can reduce the noise immunity of both analogue and digital signals. When the common mode voltage in the complementary signals is zero, both signals will change polarity with respect to a threshold at the same instant, and the signals will have opposite polarity. The threshold may be a voltage of zero or $V_{dd}/2$, depending on whether dual polarity power supplies or a single polarity power is used. If a non-zero common mode voltage is present in the signals, they will change polarity at different times, and therefore there will be periods when both signals have the same polarity. This situation can be particularly problematic in binary digital signals which are limited with respect to the threshold because small deviations are amplified to maximum amplitude by the limiting.

Compensation circuits can be used in devices transmitting differential signals to adjust the differential signals to reduce or eliminate a common mode voltage. Such adjustment can be based on an indication of the common mode voltage. There is therefore a requirement for a circuit and method for generating a control signal indicative of a common mode signal in a differential signal pair.

SUMMARY OF THE PREFERRED EMBODIMENTS

According to a first aspect there is provided a common mode control circuit for generating a control signal indicative of a common mode signal in first and second signals of a differential signal pair, the common mode control circuit comprising a first charge control means for varying charge applied to a capacitive element dependent on the polarity of the first and second signals with respect to a threshold, wherein the first charge control means is operable to maintain a direction of flow of the charge in response to the first and second signals both switching polarity simultaneously from polarities that are different in the first and second signals.

According to a second aspect there is provided a method of generating a control signal indicative of a common mode signal in first and second signals of a differential signal pair, the method comprising varying charge on a capacitive element dependent on the polarity of the first and second signals with respect to a threshold, subject to maintaining a direction of flow of the charge in response to the first and second signals both switching polarity simultaneously from polarities that are different in the first and second signals.

Such a common mode control circuit and method of generating a control signal enables a low power consumption.

The first charge control means can be operable to maintain the flow of the charge at zero in response to the first and second signals both switching polarity simultaneously from polarities that are different in the first and second signals and the flow of the charge being zero. Correspondingly, the method can comprise maintaining the flow of the charge at zero in response to the first and second signals both switching polarity simultaneously from polarities that are different in the first and second signals and the flow of the charge being zero. Therefore, if the capacitive element has been charged to a desired voltage prior to the switching, that voltage will be maintained and no power consumed in varying that voltage.

The common mode control circuit can comprise:
a first control input for the first signal;
a second control input for the second signal;
a control output for the control voltage;
wherein the capacitive element comprises a first capacitive element, a second capacitive element and a third capacitive element;
wherein a first terminal of the third capacitive element is coupled to the control output and a second terminal of the third capacitive element is coupled to a reference voltage; and
wherein the first charge control means comprises:
a NAND gate having a first input coupled to the first control input, a second input coupled to the second control input, and an output coupled to a first terminal of the first capacitive element, a second terminal of the first capacitive element being coupled to the control output; and
a NOR gate having a first input coupled to the first control input, a second input coupled to the second control input, and an output coupled to a first terminal of the second capacitive element, a second terminal of the second capacitive element being coupled to the control output.

This enables a simple implementation of the common mode control circuit.

In particular, the NAND gate can be operable to provide at its output a first voltage level in response to both the first and second signals having a first polarity with respect to the threshold and otherwise to provide at its output a second voltage level, and the NOR gate can be operable to provide at its output the second voltage level in response to both the first and second signals having a second polarity with respect to the threshold and otherwise to provide at its output the first voltage level. The first polarity may correspond to a voltage above the threshold and the second polarity may correspond to a voltage below the threshold, although the opposite assignment of polarities to voltages with respect to the threshold can alternatively be used.

The common mode control circuit can comprise a second charge control means, wherein the second charge control means is operable to vary via a resistive element the charge on the first, second and third capacitive elements in response to the first and second signals having the same polarity with respect to the threshold. The first and second charge control means in combination can provide improved control loop stability.

The common mode control circuit can be provided in a device for generating a differential signal pair, the device comprising a first signal path, a second signal path and the common mode control circuit according to the first aspect of the invention, wherein the common mode control circuit is coupled to the first signal path for receiving a first signal of the differential signal pair and to the second signal path for receiving a second signal of the differential pair, and the device is operable to control the common mode signal in response to the control signal generated by the common mode control circuit. Accordingly, there is also provided a device for generating a differential signal pair, the device comprising a first signal path, a second signal path and the common mode control circuit according to the first aspect of the invention, wherein the common mode control circuit is coupled to the first signal path for receiving a first signal of the differential signal pair and to the second signal path for receiving a second signal of the differential pair, and the device is operable to control the common mode signal in response to the control signal generated by the common mode control circuit.

The common mode control circuit can be provided in an apparatus for generating a pulse width modulated differential signal pair, the apparatus comprising the device for generating a differential signal pair. Accordingly, there is provided an apparatus for generating a pulse width modulated differential signal, the apparatus comprising the device for generating a differential signal pair.

The apparatus for generating a pulse width modulated signal can be provided in an integrator. Accordingly, there is provided an integrator comprising the apparatus for generating a pulse width modulated signal.

BRIEF DESCRIPTION OF THE DRAWINGS

Preferred embodiments will now be described, by way of example only, with reference to the accompanying drawings in which.

DETAILED DESCRIPTION OF THE PREFERRED EMBODIMENTS

Figure 1:
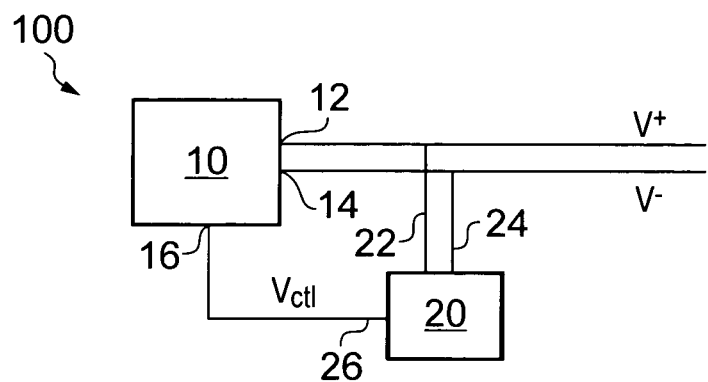
FIG. 1 is a schematic diagram of a device for generating a differential signal pair.

Referring to FIG. 1, a device 100 for generating a differential signal pair has a signal source 10 having a first output 12 for a first signal $V^+$ of a differential signal pair and a second output 14 for a second signal $V^-$ of the differential signal pair. A common mode control circuit 20 has a first control input 22 coupled to the first output 12 of the signal source 10 for receiving the first signal $V^+$, and a second control input 24 coupled to the second output 14 of the signal source 10 for receiving the second signal $V^-$. The common mode control circuit 20 generates a control signal $V_{ctl}$ at a control output 26 of the common mode control circuit 20 in response to the first signal $V^+$ and the second signal $V^-$. The control output 26 of the common mode control circuit 20 is coupled to a control input 16 of the signal source 10 for delivering the control signal $V_{ctl}$ to the signal source 10. In response to the control signal $V_{ctl}$, the signal source 10 adjusts a common mode signal of the first signal $V^+$ and the second signal $V^-$.

Figure 2:
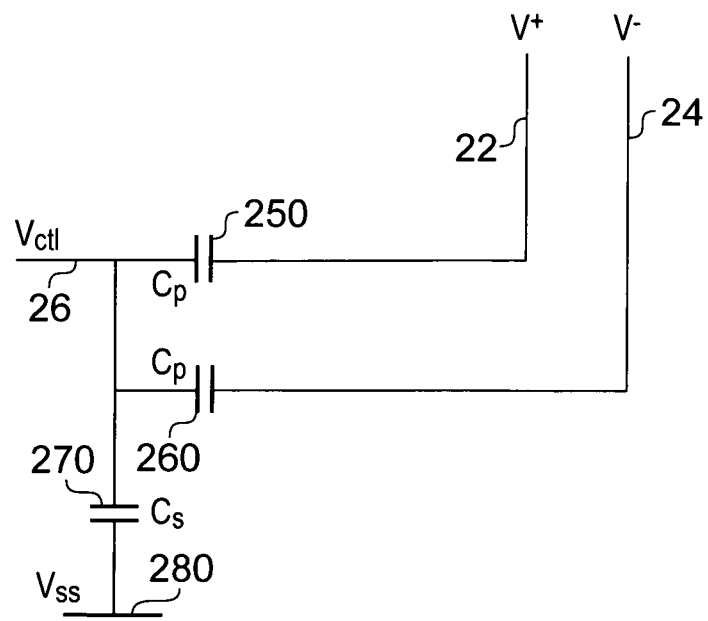
FIG. 2 is a schematic diagram of a common mode control circuit

The control signal $V_{ctl}$ can be derived by summing the first signal $V^+$ and second signal $V^-$ of the differential pair signal $V^+$, $V^-$. A low complexity common mode control circuit for forming this sum is illustrated in FIG. 2. A first capacitive element 250 having a capacitance $C_p$ has a first terminal coupled to the first control input 22 and a second terminal coupled to the control output 26. A second capacitive element 260 having a capacitance $C_p$ has a first terminal coupled to the second control input 24 and a second terminal coupled to the control output 26. A third capacitive element 270 having a capacitance $C_s$ has a first terminal coupled to the control output 26 and a second terminal coupled to a supply voltage $V_{ss}$, which may be ground, although any convenient reference voltage may be used instead. Variation in the first signal $V^+$ results in a first current flowing in the first capacitive element 250, and variations in the second signal $V^-$ results in a second current flowing in the second capacitive element 260. These first and second currents both flow in the third capacitive element 270, with the result that the control signal $V_{ctl}$ is indicative of the sum of the first and second signals $V^+$, $V^-$.

However, a drawback of the common mode control circuit illustrated in FIG. 2 is the flow of current in the first and second capacitive elements 250, 260 because the first and second signals $V^+$, $V^-$ vary, even when the control signal $V_{ctl}$ has reached a steady value and adjustment has been made to remove any common mode signal from the first and second signals $V^+$, $V^-$. The flow of current can result in power being consumed. This is particularly significant when the first and second signals $V^+$, $V^-$ are binary signals varying between maximum and minimum operating voltages $V_{dd}$ and $V_{ss}$ as the current flow is maximised.

Figure 3:
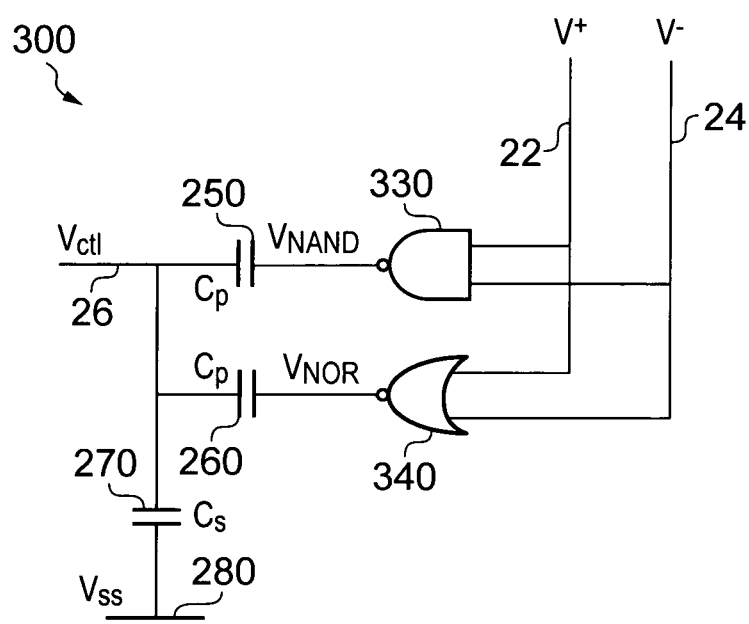
FIG. 3 is a schematic diagram of a common mode control circuit.

Referring to FIG. 3, there is illustrated another embodiment of a common mode control circuit 300 which may be employed as the common mode control circuit 20 in the device 100 of FIG. 1. The common mode control circuit 300 has a first control input 22, a second control input 24, and a control output 26, these corresponding to the elements of FIGS. 1 and 2 having the same reference numerals. The common mode control circuit 300 also has first, second and third capacitive elements 250, 260, 270 corresponding to the elements of FIG. 2 having the same reference numerals. The control input 22 is coupled to a first input of a NAND gate 330 and to a first input of a NOR gate 340, and the control input 24 is coupled to a second input of the NAND gate 330 and to a second input of the NOR gate 340. The third capacitive element 270 has a first terminal coupled to the control output 26 and a second terminal coupled to a supply voltage $V_{ss}$, which may be ground, although any convenient reference voltage may be used instead. An output of the NAND gate 330 is coupled to a first terminal of the first capacitive element 250, and a second terminal of the first capacitive element 250 is coupled to the control output 26. An output of the NOR gate 340 is coupled to a first terminal of the second capacitive element 260 and a second terminal of the second capacitive element 260 is coupled to the control output 26.

Considering $V_{ss}$ to be zero for simplicity, the control signal $V_{ctl}$ under stead state conditions may be expressed as $$V_{ctl} = \frac{C_p}{2C_p + C_s} \cdot (V_{NAND} + V_{NOR}) \quad (1)$$

where $V_{NAND}$ is the voltage at the output of the NAND gate 330, and $V_{NOR}$ is the voltage at the output of the NOR gate 340. Under dynamic conditions, as the first and second signals $V^+$, $V^-$ vary, the control signal $V_{ctl}$ will tend towards the value given by equation (1) at a rate dependent on first and second signals $V^+$, $V^-$ and the capacitance values $C_s$ and $C_p$.

Representing the polarities of the first and second signals $V^+$, $V^-$ relative to a threshold by a binary zero or binary one, and assuming, for convenience, a binary zero to be represented by 0 Volts and a binary one to be represented by 1 Volt, the voltage values of $V_{NAND}$, $V_{NOR}$ and $V_{NAND}+V_{NOR}$, are shown in Table 1 for all combinations of polarity of the first and second signals $V^+$ and $V^-$.

TABLE 1

| $V^+$ | $V^-$ | $V_{NAND}$ | $V_{NOR}$ | $V_{NAND} + V_{NOR}$ |
|---|---|---|---|---|
| 0 | 0 | 1 V | 1 V | 2 V |
| 0 | 1 | 1 V | 0 V | 1 V |
| 1 | 0 | 1 V | 0 V | 1 V |
| 1 | 1 | 0 V | 0 V | 0 V |

When the first and second signals $V^+$, $V^-$ have a common mode signal, their polarities will not change at the same instant, and therefore they may temporarily adopt the same polarity. It can be seen from Table 1 that the voltage $V_{NAND}+V_{NOR}$, and therefore the control voltage $V_{ctl}$, will change when the polarity of only one of the first and second signals $V^+$, $V^-$ changes, or when both $V^+$ and $V^-$ have the same polarity and both change polarity. Therefore the changes in the control signal $V_{ctl}$ can be used to adjust the common mode signal. Also, under these changes in polarity, the charge on the third capacitive element 270 changes, and the charge on one of the first and second capacitive elements 250, 260 changes. Therefore, when there is a common mode signal present in the first and second signals $V^+$, $V^-$, power may be consumed by the flow of current in the first, second or third capacitive elements 250, 260, 270 due to the changes in polarity of $V^+$ and $V^-$.

When the first and second signals $V^+$, $V^-$ have no common mode signal, any common mode signal having been cancelled by the action of the control voltage $V_{ctl}$, the first and second signals $V^+$, $V^-$ change polarity simultaneously and have opposite polarities. Under these circumstances, $V_{NAND}+V_{NOR}$ is constant, and therefore the control signal $V_{ctl}$ is constant, apart from any residual change due to the charging of the first, second and third capacitive elements 250, 260, 270 resulting from earlier changes in $V_{NAND}+V_{NOR}$. Moreover, $V_{NAND}$ and $V_{NOR}$ are both constant, and so the current flow in the first, second or third capacitive elements 250, 260, 270, tends to zero, with no flow of charge to or from these capacitive elements under steady state conditions. Therefore, when there is no common mode signal in the first and second signals $V^+$, $V^-$, no power is consumed by the flow of current in the first, second or third capacitive elements 250, 260, 270, despite the changes in polarity of $V^+$ and $V^-$.

In this way, power consumption by the common mode control circuit 300 is constrained primarily to the transient condition when the common mode signal is present. When the common mode signal has been cancelled, the power consumption is very low.

The time taken for charge to flow to and from the first, second and third capacitive elements 250, 260, 270 imposes a constraint on the frequency at which the common mode control circuit 300 can operate. The frequency of operation can be increased by decreasing the capacitance values $C_s$ and $C_p$.

Figure 4:
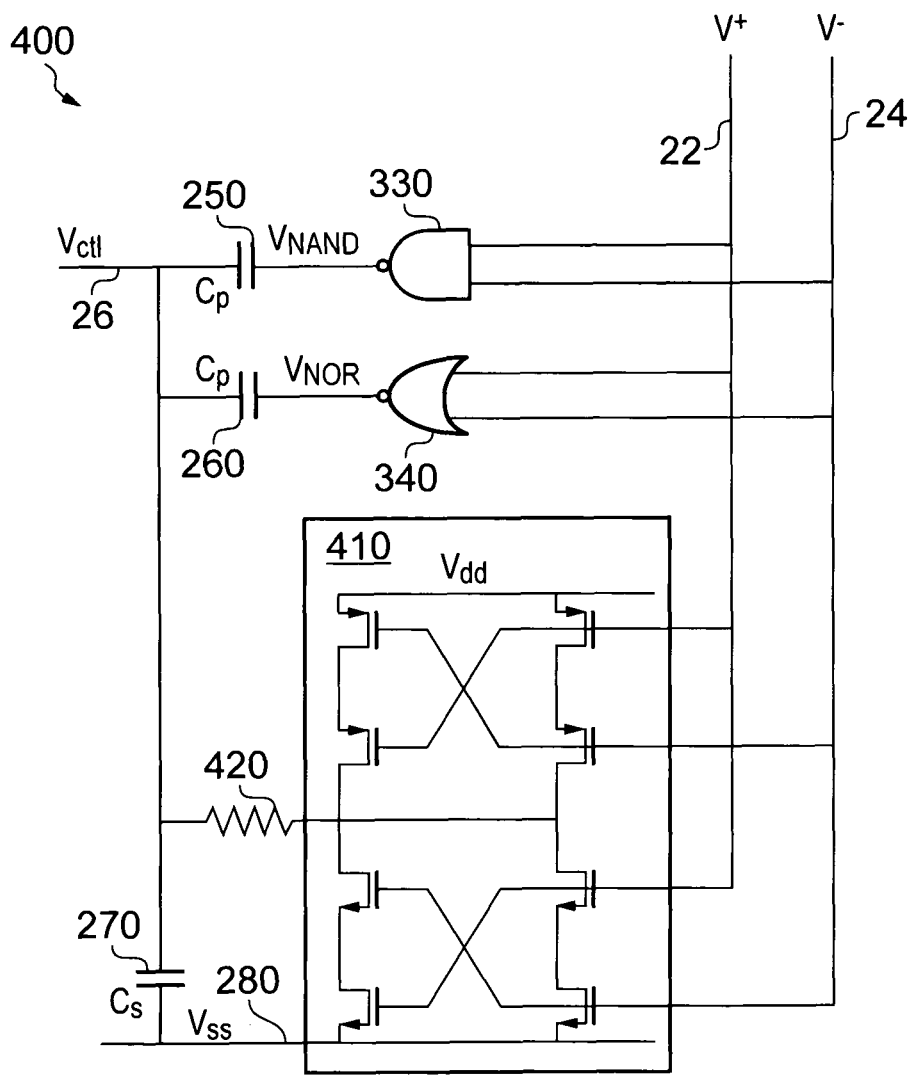
FIG. 4 is a schematic diagram of a common mode control circuit.
Figure 10:
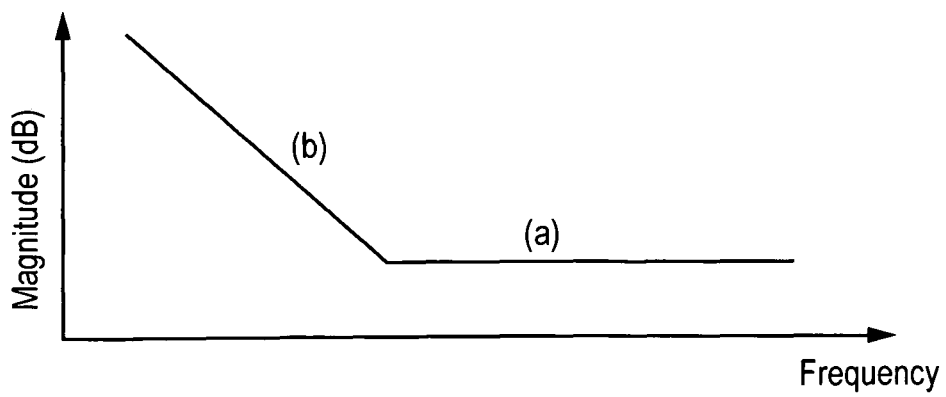
FIG. 10 is a Bode plot showing magnitude as a function of frequency.

Referring to FIG. 4, there is illustrated another embodiment of a common mode control circuit 400 which may be employed as the common mode control circuit 20 in the device 100 of FIG. 1. The common mode control circuit 400 includes all elements of the common mode control circuit 300 illustrated in FIG. 3, these having the same reference numerals and operating in the same way as in the embodiment of FIG. 3, plus an additional switching element 410 and a resistive element 420. The switching element 410 has first and second inputs coupled to the first control input 22, third and fourth inputs coupled to the second control input 24, and an output coupled to a first terminal of the resistive element 420. A second terminal of the resistive element 420 is coupled to the first terminal of the third capacitive element 270 and therefore is coupled to the control output 26. The switching element 410 is powered by supply voltages $V_{ss}$ and $V_{dd}$, which for convenience are assumed to be 0 and 1 Volt respectively.

When the first and second signals $V^+$, $V^-$ are both above the threshold, the output of the switching element 410 is at 0 Volt and current flows from the first, second and third capacitive elements 250, 260, 270 via the resistive element 420. When the first and second signals $V^+$, $V^-$ are both below the threshold, the output of the switching element 410 is at 1 Volt and current flows to the first, second and third capacitive elements 250, 260, 270 via the resistive element 420. When the first and second signals $V^+$, $V^-$ have opposite polarities, the output of the switching element 410 is at an intermediate voltage and no current flows to or from the first, second and third capacitive elements 250, 260, 270 via the resistive element 420. Therefore, the switching element 410, resistive element 420 and the first, second and third capacitative elements 250, 260, 270 provide an integrating path for establishing $V_{ctl}$, whereas the NAND gate 230, NOR gate 240, and first, second and third capacitive elements 250, 260, 270 provide a feed-forward path for establishing $V_{ctl}$.

The control signal $V_{ctl}$ due to the action of the switching element 410 and the resistive element 420 may be expressed as $$V_{ctl} = -kf(V^+ + V^- - V_{dd}) \quad (2)$$

where k is a constant dependent on the values $C_p$ and $C_s$, the resistance of the resistive element 420, and the supply voltages $V_{ss}$ and $V_{dd}$.

Figure 9:
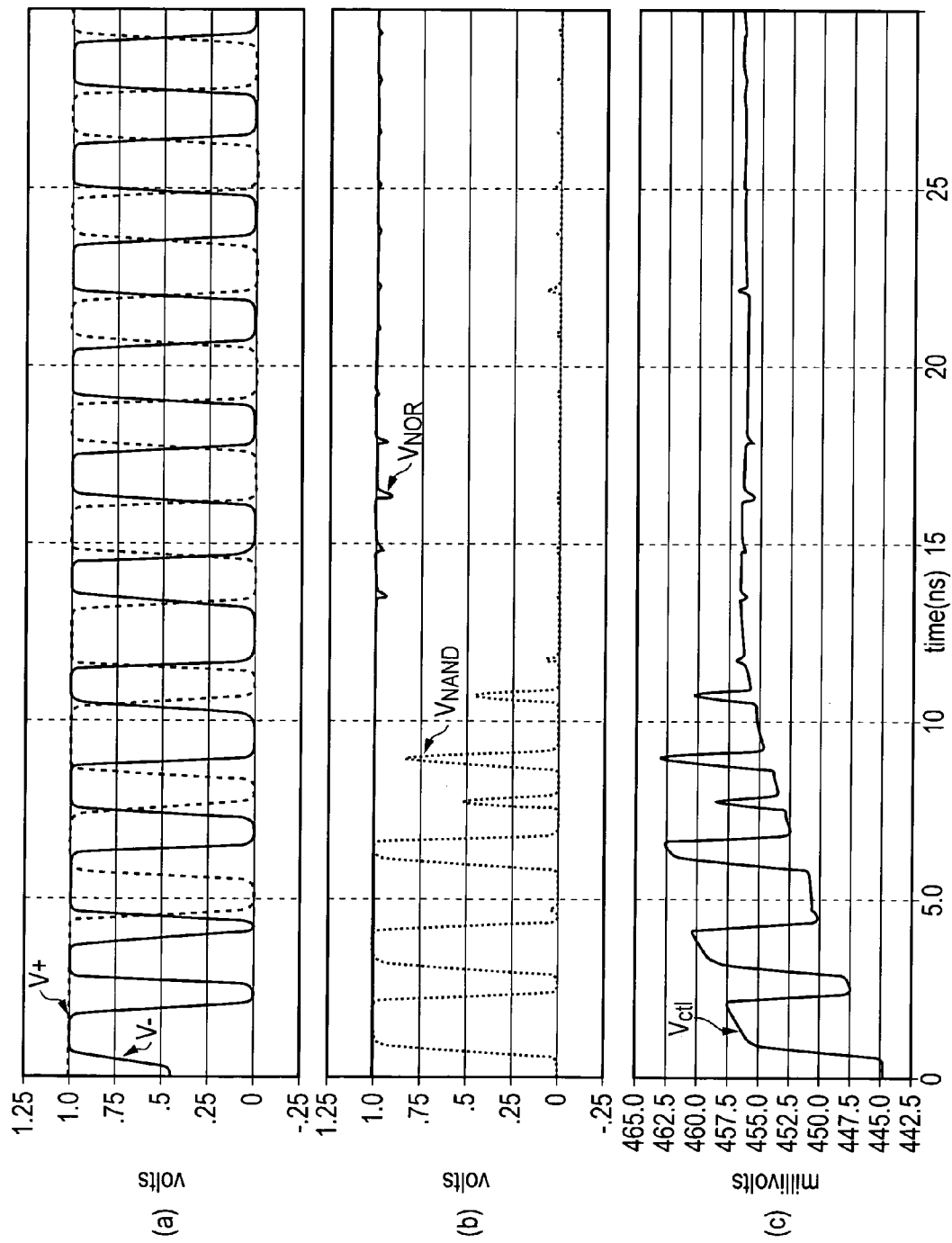
FIG. 9 illustrates waveforms of signals relating to a common mode control circuit.

The expression for $V_{ctl}$ in equation (1) is independent of frequency. However, the action of the switching element 410, the resistive element 420 and the first, second and third capacitive elements 250, 260, 270, as represented by equation (2), is frequency dependent, providing −20 dB gain per decade increase in frequency. This frequency response, in conjunction with the frequency independent operation of the elements of the common mode control circuit 300, provides the combined frequency response illustrated in the Bode plot of FIG. 9 in which portion (a) corresponds to the contribution of the elements of the common mode control circuit 300 to the frequency response, and portion (b) corresponds to the additional contribution of the switching element 410 and the resistive element 420 to the frequency response. The common mode control circuit 400, when used as the common mode control circuit 20 of FIG. 1, forms a control loop in conjunction with the signal source 10, and the junction of portion (a) and portion (b) in FIG. 9 represents a zero in the frequency response of the control loop. The different frequency characteristics of each of the common mode control circuits 300, 400 provide different stability characteristics. The frequency response of the common mode control circuit 400 provides enhanced accuracy over the frequency response of the common mode control circuit 300.

Figure 5:
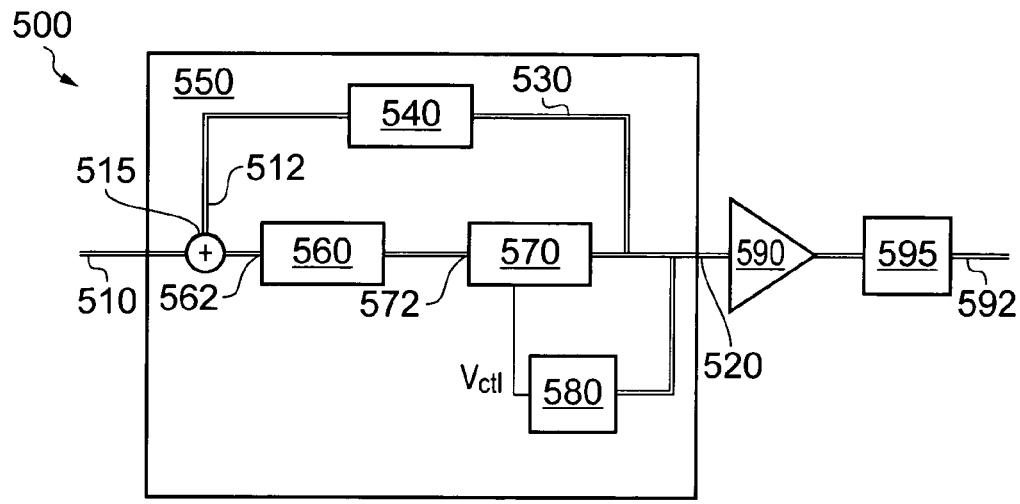
FIG. 5 is a schematic diagram of an integrator.

FIG. 5 illustrates an integrator 500 comprising an apparatus 550 for generating a pulse width modulated signal pair, the apparatus 550 having a common mode control circuit 580. Each element of the integrator 500 operates with a differential signal pair at its respective input and output, except that the control signal $V_{ctl}$ is a single ended signal. Where the following description refers to a differential signal, it is to be understood that the differential signal comprises a differential signal pair of complementary signals.

The apparatus 550 has an input 510 for a differential input signal and an output 520 for a differential oscillation signal pulse width modulated by an integral of the differential input signal. The output 520 of the apparatus 550 is coupled to an input of an amplification stage 590 for amplifying the differential pulse width modulated signal delivered by the apparatus 550. An output of the amplification stage 590 is coupled to an input of a filter 595 for attenuating frequencies outside of the bandwidth of interest of the differential input signal. The filter 595 may have, for example, a low pass frequency response or a band pass frequency response. In some embodiments, the amplification stage 590 may be omitted if the desired gain is provided by the apparatus 550, and the filter 595 may be omitted if not required or if filtering is provided in another device to which the integrator 500 is coupled.

In the following paragraphs, for clarity the operation of the integrator 500 will be explained for only one signal of a differential signal pair. However, it should be understood that the integrator 500 operates in the same manner for the other signal of the differential pair.

The apparatus 550 for generating a pulse width modulated signal has an amplification and phase shifting element 570 having an input 572 and an output coupled to the output 520 of the apparatus 550 for delivering a limited signal dependent on a signal at the input 572 of the amplification and phase shifting element 570.

There is a feedback path 530 coupled between the output 520 of the apparatus 550 and the input 572 of the amplification and phase shifting element 570, outside of the amplification and phase shifting element 570. The feedback path 530 and the amplification and phase shifting element 570 therefore in combination form a loop, or in fact a pair of loops, one for each component of a differential signal. The feedback path 530 causes oscillation in the loop. The oscillation frequency is dependent on the amount of phase shift in the loop, in particular in the amplification and phase shifting element 570. The oscillation frequency is arranged to be higher than the highest frequency of interest in the spectrum of the input signal, and can be selected to be, for example, ten times the highest frequency of interest in the spectrum of the input signal.

The feedback path 530 comprises a capacitive element 540, a summing stage 515 and a filter 560. A first terminal of the capacitive element 540 is coupled to the output 520 of the apparatus 550 and a second terminal of the capacitive element 540 is coupled to a first input 512 of the summing stage 515. A second input of the summing stage 515 is coupled to the input 510. The summing stage 515 forms the sum of a signal fed back from the output 520 of the apparatus 550 via the capacitive element 540 and the input signal applied at the input 510. This sum is delivered at an output of the summing stage 515 which is coupled to an input 562 of the filter 560. An output of the filter 560 is coupled to the input 572 of the amplification and phase shifting element 570.

The loop also includes an inversion, as required for oscillation and integration, which may be introduced by any of the loop components, that is by the amplification and phase shifting element 570, the summing stage 515 or the filter 560, or may be introduced by a separate inverting stage (not illustrated). Indeed, inversions may occur at a plurality of locations within the loop, provided that overall there is an odd number of inversions in the loop.

The capacitive element 540, in conjunction with the amplification provided by the amplification and phase shifting element 570 and the inherent input impedance of the summing stage 515 provides integration of the input signal. Furthermore, the summing by the summing stage 515 of the input signal and the oscillation signal in the loop causes the oscillation signal to be modulated by the integral of input signal, such that the oscillation signal is dependent on the integral of the input signal. In particular, as the oscillation signal will have a finite rise time due to the finite bandwidth inherent in the elements of the loop, particularly the filter 560, the time at which the oscillation signal crosses a threshold, such as a voltage midway between minimum and maximum supply voltages, will be dependent on the input signal, or more specifically on the integral of the input signal. In this way the width of pulses in the oscillation signal can be modulated, thereby resulting in an oscillation signal pulse width modulated by an integral of the input signal.

The limited signal at the output 520 of the apparatus 550 is a substantially binary wave at the oscillation frequency, having fast transitions between binary levels. With the correct input common mode voltage and no input differential voltage applied at the input 510, the limited signal has a substantially 50% duty cycle.

The filter 560 attenuates spectral components at the oscillation frequency and higher frequencies relative to spectral components in the bandwidth of the input signal. For example, the filter 560 may attenuate spectral components at the oscillation frequency and all higher frequencies by an equal amount, or the attenuation may increase for frequencies above the oscillation frequency. Without such attenuation, the amplitude of the oscillating signal at the input 572 of the amplification and phase shifting element 570 would increase to the minimum and maximum supply voltages, thereby saturating the amplification and phase shifting element 570 and preventing it from providing any amplification. Under such conditions the amplitude of the signal at both the input 572 and output of the amplification and phase shifting element 570 would be identical and equal to the difference between the power supply voltage rails, and consequently no amplification would occur. In particular, this condition would prevent the amplification and phase shifting element 570 from amplifying spectral components in the bandwidth of the input signal, and therefore prevent the integrator 500 from integrating the input signal. Therefore, the filter 560 ensures that the signal at the input 572 of the amplification and phase shifting element 570 is smaller than the input dynamic range of the amplification and phase shifting element 570, thereby ensuring that the amplification and phase shifting element 570 can provide amplification. Typically, the amplification and phase shifting element 570 may provide amplification in the region of 40 to 80 dB. In the embodiments described, the amplification and phase shifting element 570 saturates and delivers a limited, voltage rail to voltage rail signal at the output 520, although this is not essential. The filter 560 does not attenuate, or provides a relatively low attenuation to, spectral components within the bandwidth of interest of the input signal applied at the input 510 of the integrator 500.

The oscillation frequency can be chosen at a convenient value to facilitate the filtering by the filter 560 with minimal complexity. The oscillation frequency can also be chosen at a convenient value to facilitate subsequent amplification of the pulse width modulated signal by the amplification stage 590 and subsequent recovery of the input signal from the pulse width modulated signal by filtering in the filter 595.

By way of example, in one embodiment the frequencies of interest in the input signal may occupy 0 to 10 MHz, the oscillation frequency may be 100 MHz, and the filter 560 may provide 0 dB gain for frequencies up to around 10 MHz and 25 dB attenuation for frequencies of 100 MHz and higher. In other embodiments, other values may be used for each of these parameters.

The input signal may be injected into the feedback loop at alternative locations. For example, the input signal may summed with the signal fed back from the output 520 of the apparatus 550 after filtering by the filter 560, because the filtering is not required to affect the input signal.

As already stated, the apparatus 550, the amplifier 590 and the filter 595 operate with differential signals. In particular, the limited pulse width modulated signal generated by the amplification and phase shifting element 570 and delivered at the output 520 comprises a differential signal pair. Therefore, a common mode control circuit 580 is included to enable control of the common mode voltage in the differential signal pair delivered at the output 520. The common mode control circuit 580 may be the common mode control circuit 300 or 400 described above, and has inputs coupled to the output 520 for receiving the differential signal pair, and an output coupled to the amplification and phase shifting element 570 for delivering the control signal $V_{ctl}$.

Figure 6:
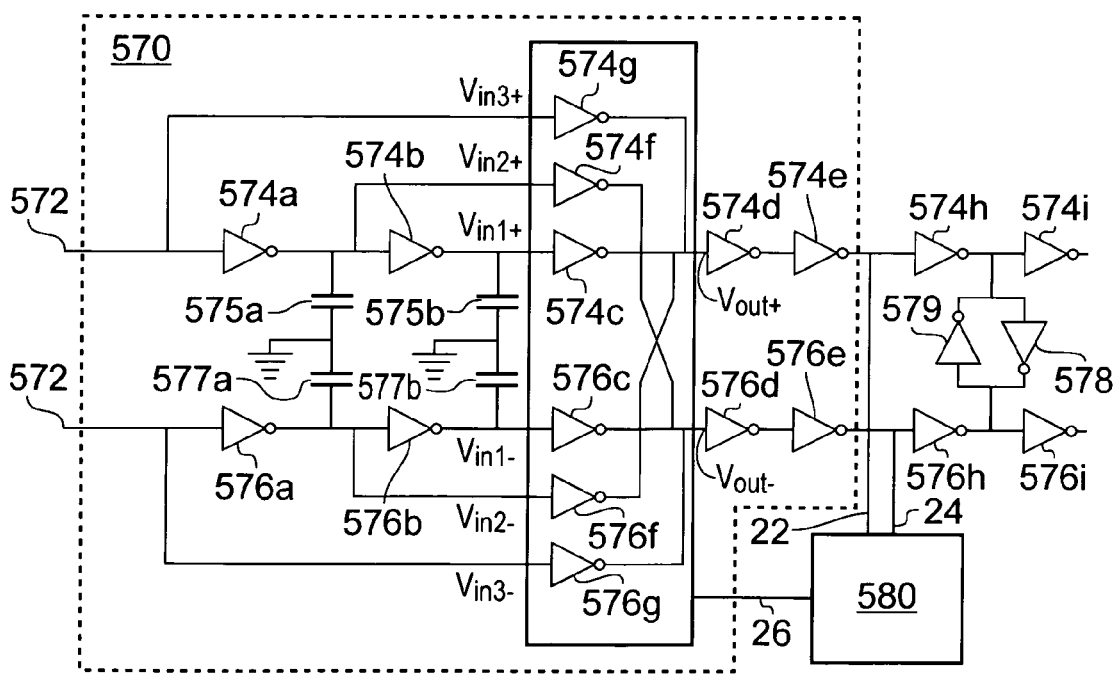
FIG. 6 is a schematic diagram of a device for generating a differential signal pair.

FIG. 6 illustrates the amplification and phase shifting element 570 in more detail. There is a pair of inputs 572 for a differential signal pair. One signal of the signal pair passes through a first signal path comprising inverters 574a-e coupled in series. The other signal of the signal pair passes through a second signal path comprising inverters 576a-e coupled in series. Outputs of the inverters 574a-b and 576a-b are coupled to ground, or alternatively a reference voltage, via capacitive elements 575a-b and 577a-b respectively. These capacitive elements 575a-b, 577a-b, in conjunction with the input impedance of the inverters 574b-c, 576b-c, provide additional filtering, attenuating frequencies at the oscillation frequency and higher to ensure that the inverters 574b-c, 576b-c are able to provide amplification, in addition to the amplification provided by the initial inverters 574a, 576a. At least the inverters 574a-b, 576a-b may be operated in a non-limiting mode, such that the signals at their respective outputs need not have the maximum amplitude corresponding to the voltage difference between supply rails. Indeed, the capacitive elements 575a-b, 577a-b may load their respective preceding inverters 574a-b, 576a-b to increase the rise times of signals at the outputs of these inverters 574a-b, 576a-b and prevent limiting. In this way the capacitive elements 575a-b, 577a-b also provide phase shifting within the loop.

Additional signal paths are provided by: an inverter 574f having an input coupled to an input of inverter 574b and an output coupled to the input of inverter 576d; an inverter 574g having an input coupled to an input of inverter 574a and an output coupled to an input of inverter 574d; an inverter 576f having an input coupled to an input of inverter 576b and an output coupled to an input of inverter 574d; an inverter 576g having an input coupled to an input of inverter 576a and an output coupled to an input of inverter 576d. The amplification and phase shifting element 570 limits signals applied at the inputs 572, such that signals at the outputs of inverters 574e and 576e are limited signals. The output of inverter 574e is coupled to the input 22 of the common mode control circuit 580, and the output of inverter 576e is coupled to the input 24 of the common mode control circuit 580. The output 26 of the common mode control circuit 580 is coupled to control the inverters 574c, f and g and 576c, f, and g as explained below.

By means of the plurality of signal paths through the amplification and phase shifting element 570, the amplification and phase shifting element 570 can enable stable operation, ensuring that the loop oscillates only at the desired high oscillation frequency and does not oscillate at a low frequency.

Figure 7:
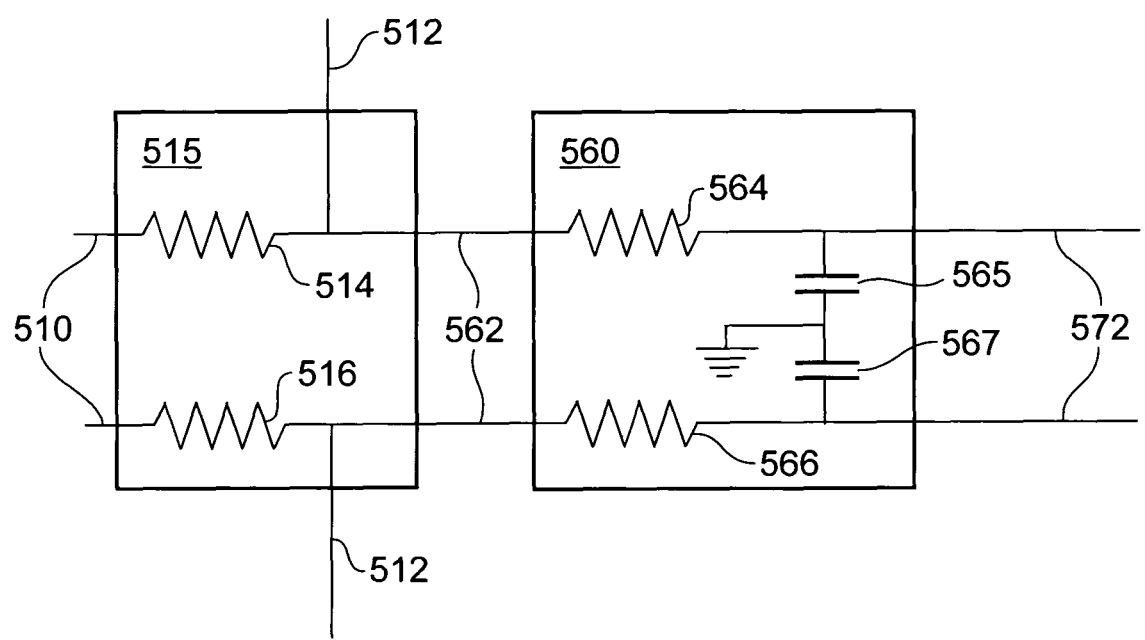
FIG. 7 is a schematic diagram of a summing stage and a filter.

FIG. 7 is a schematic diagram of the summing stage 515 and the filter 560. The summing stage 515 comprises resistors 514, 516 having an equal value coupled between the first inputs 510 of the apparatus 550 and the outputs of the summing stage 515, in respective differential signal paths. Second inputs 512 of the summing stage 515 are coupled intermediate the resistive elements 514, 516 and the respective outputs of the summing stage 515 for respective differential signal paths. The outputs of the summing stage 515 are coupled to inputs 562 of the filter 560 in respective differential signal paths.

The filter 560 comprises resistors 564, 566 having an equal value coupled between the inputs 562 of the filter 560 and outputs of the filter 560 in respective differential signal paths. Capacitive elements 565, 567 having an equal value are to coupled ground, or alternatively to a reference voltage, from intermediate the respective resistive elements 564, 566 and the respective outputs of the filter 560.

Figure 8:
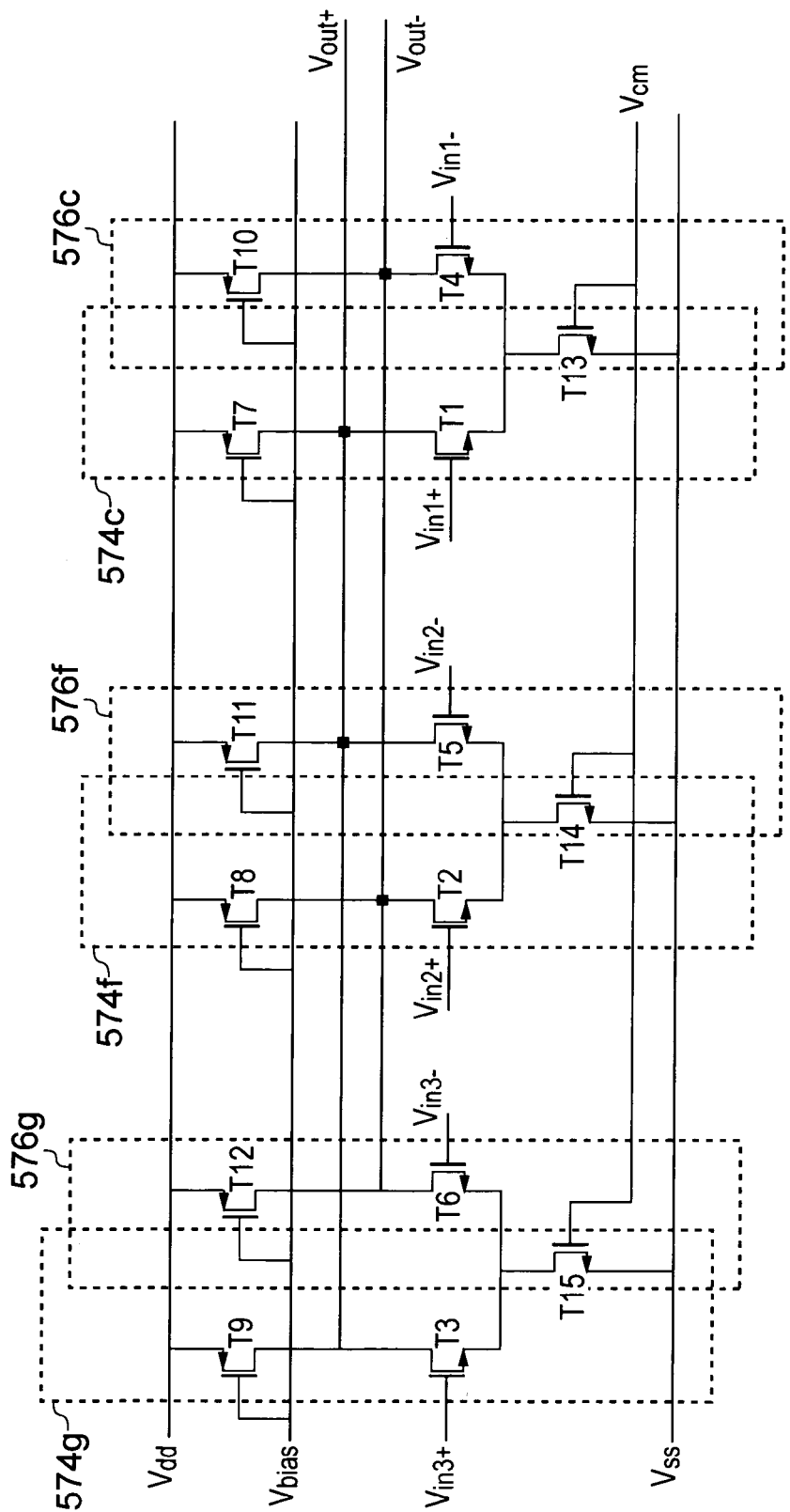
FIG. 8 is a schematic diagram of a circuit having provision for common mode adjustment.

FIG. 8 is a schematic diagram of the inverters 574c, f and g and 576c, f, and g having, respectively, input voltages $V_{in1+}$, $V_{in2+}$, $V_{3in+}$, $V_{in1-}$, $V_{in2-}$, $V_{3in-}$ at respective input transistors T1 to T6, with T1/T4, T2/T5, and T3/T6 forming respective differential pairs, and with an output voltage $V_{out+}$ for delivery to the input of inverter 574d and an output voltage $V_{out-}$ for delivery to the input of inverter 576d. A bias voltage $V_{bias}$ is provided to bias transistors T7 to T12 to establish a bias current in the input transistors T1 to T6, and a common mode voltage $V_{cm}$ is supplied to respective current source transistors T13, T14 and T15 for controlling a common mode signal in respective transistor differential pairs T1/T4, T2/T5, T3/T6. The common mode voltage $V_{cm}$ may be the control signal $V_{ctl}$ directly, or may be derived from $V_{ctl}$.

FIG. 9 illustrates waveforms of signals, under start-up conditions, in an embodiment of the common mode control circuit 400 of FIG. 4 when employed as the common mode control circuit 580 for the apparatus 550. Graph (a) in FIG. 9 shows, in the solid line, the first signal $V^+$ which is applied to the input 22 of the common mode control circuit 580, and in the dashed line, the second signal $V^-$ which is applied to the input 24 of the common mode control circuit 580. Both $V^+$ and $V^-$ are limited signals, being substantially two-level at 0 Volt and 1 Volt, although having a finite transition time between levels. Both $V^+$ and $V^-$ exhibit oscillations due to the feedback provided by the signal path 530. Initially, $V^-$ has a small voltage offset, resulting in the duty cycle deviating from 50% by a relatively small amount, whereas $V^+$ has a large voltage offset, such that it remains at 1 Volt for an initial period while $V^-$ is oscillating. Graph (b) in FIG. 9 shows, in the dashed line, voltage $V_{NAND}$, and in the solid line, voltage $V_{NOR}$. It can be seen that $V_{NAND}$ rises to 1 Volt, or at least commences a rise to 1 Volt, only when both $V^+$ and $V^-$ are at 1 Volt, and $V_{NOR}$ deviates from 1 Volt only when both $V^+$ and $V^-$ are at 0 Volt. Graph (c) in FIG. 9 shows the control signal $V_{ctl}$ which is derived from $V_{NAND}$ and $V_{NOR}$ charging and discharging the first second and third capacitive elements 250, 260, 270 and the voltage at the output of the switching element 410 charging and discharging the first second and third capacitive elements 250, 260, 270 via the resistive element 420. The control signal $V_{ctl}$ is employed to adjust the common mode voltage $V_{cm}$ and consequently in graph (a) $V^+$ and $V^-$ approach simultaneous, but inverse, transitions between voltages for both $V^+$ and $V^-$, and in graph (b) $V_{NAND}$ tends to a constant value of 0 Volt and $V_{NOR}$ tends to a constant value of 1 Volt.

Referring again to FIG. 6, there are further elements not yet discussed which may be incorporated in the embodiment of FIG. 5, although they are not illustrated in FIG. 5. The first signal path is extended from the output of inverter 574e by series coupled inverters 574h and 574i, and the second signal path is extended from the output of inverter 576e by series coupled inverters 576h and 576i. A further inverter 578 has an input coupled between the inverters 574h and 574i, and an output coupled between the inverters 576h and 576i. A further inverter 579 has an input coupled between the inverters 576h and 576i, and an output coupled between the inverters 574h and 574i. The inverters 574h-i and 576h-i provide buffering for the inverters 578, 579. The inverters 578, 579 accelerate establishment of an approximate common mode control voltage $V_{cm}$ at power-on or when a step occurs in the supply voltage $V_{dd}$, at the expense of increased power consumption. When the common mode control circuit 580 has reached a stable operating value for the control voltage $V_{ctl}$, the power consumption of the inverters 578, 579 decreases. In addition, the inverters 578, 579 ensure that both signal paths of the apparatus 550 oscillate at the same frequency. The explanation of embodiments is based, for convenience, on the assumption that the supply voltage $V_{ss}$ is zero, and that polarities are represented by a binary zero and a binary one, being represented 0 Volt and 1 Volt respectively. However, a skilled person will appreciate that the explanations can be readily generalised to other representations and voltages, and that the principles of operation are equally valid for embodiments employing other voltages.

The term signal is not intended to imply any specific type of physical representation, except where explicitly stated. Types of physical representation can include an electrical current, and electrical voltage, an optical emission, or any other form.

The first and second signals $V^+$, $V^-$ may be analogue or digital signals.

Although equation (1) is based on the assumption that the first and second capacitive elements 260, 270 have an equal capacitance value $C_p$, a skilled person will appreciate that equation (1) can be readily adapted for unequal capacitance values.

To avoid circuitry being loaded, in some embodiments it may be necessary to provide buffers in lines conveying signals. For example a buffer may be provided in the signal line coupling the first signal $V^+$ to the first control input 22 and in the signal line coupling the second signal $V^-$ to the second control input 24. Such buffers may introduce inversion of signals. However, a skilled person will appreciate that the above explanation can be readily adapted to take account of such inversions and that the principles of operation are equally valid for embodiments employing such inversions.

Features which are described in the context of separate embodiments may also be provided in combination in a single embodiment. Conversely, various features which are, for brevity, described in the context of a single embodiment, may also be provided separately or in any suitable sub-combination.

For the sake of completeness it is also stated that the term "comprising" does not exclude other elements or steps, the term "a" or "an" does not exclude a plurality, and reference signs in the claims shall not be construed as limiting the scope of the claims.

The invention claimed is:

1. A common mode control circuit operable to generate a control signal indicative of a common mode signal in first and second signals of a differential signal pair, the common mode control circuit comprising:
    a first control input for the first signal;
    a second control input for the second signal;
    a control output for the control signal;
    a capacitive element comprising a first capacitive element, a second capacitive element and a third capacitive element;
    a first charge controller operative to vary charge applied to the capacitive element dependent on polarity of the first and second signals with respect to a threshold, the first charge controller comprising
        a NAND gate having a first input coupled to the first control input, a second input coupled to the second control input, and an output coupled to a first terminal of the first capacitive element, a second terminal of the first capacitive element being coupled to the control output; and
        a NOR gate having a first input coupled to the first control input, a second input coupled to the second control input, and an output coupled to a first terminal of the second capacitive element, a second terminal of the second capacitive element being coupled to the control output;
    wherein a first terminal of the third capacitive element is coupled to the control output and a second terminal of the third capacitive element is coupled to a reference voltage; and
    wherein first charge controller is operable to maintain a direction of flow of the charge in response to the first and second signals both switching polarity simultaneously from opposite polarities.

2. The common mode control circuit of claim 1, wherein the first charge control means is operable to maintain the flow of the charge at zero in response to the first and second signals both switching polarity simultaneously from opposite polarities and the flow of the charge being zero.

3. The common mode control circuit of claim 1, wherein the NAND gate is operable to provide at its output a first voltage level in response to both the first and second signals having a first polarity with respect to a threshold and otherwise to provide at its output a second voltage level, and the NOR gate is operable to provide at its output the second voltage level in response to both the first and second signals having a second polarity with respect to the threshold and otherwise to provide at its output the first voltage level.

4. The common mode control circuit of claim 3, wherein the first polarity corresponds to a voltage above the threshold and the second polarity corresponds to a voltage below the threshold.

5. The common mode control circuit of claim 1 further comprising:
    a second charge control means operable to vary, via a resistive element, the charge on the first, second and third capacitive elements in response to the first and second signals having the same polarity with respect to the threshold.

6. An amplification and phase shifting device operable to generate a stabilized differential signal pair, comprising:
a first signal path;
a second signal path; and
a common mode control circuit operable to generate a control signal indicative of a common mode signal in first and second signals of the differential signal pair, the common mode control circuit comprising
a first control input for the first signal;
a second control input for the second signal;
a control output for the control signal;
a capacitive element comprising a first capacitive element, a second capacitive element and a third capacitive element;
a first charge controller for varying charge applied to the capacitive element dependent on polarity of the first and second signals with respect to a threshold, the first charge controller comprising:
a NAND gate having a first input coupled to the first control input, a second input coupled to the second control input, and an output coupled to a first terminal of the first capacitive element, a second terminal of the first capacitive element being coupled to the control output; and
a NOR gate having a first input coupled to the first control input, a second input coupled to the second control input, and an output coupled to a first terminal of the second capacitive element, a second terminal of the second capacitive element being coupled to the control output;
wherein the first charge controller is operable to maintain a direction of flow of the charge in response to the first and second signals both switching polarity simultaneously from polarities that are different in the first and second signals;
wherein a first terminal of the third capacitive element is coupled to the control output and a second terminal of the third capacitive element is coupled to a reference voltage;
wherein the common mode control circuit is coupled to the first signal path for receiving the first signal of the differential signal pair and to the second signal path for receiving the second signal of the differential pair; and
wherein the device is operable to control the common mode signal in response to the control signal generated by the common mode control circuit.

7. The device of claim 6, further comprising:
a feedback path operable to generate a pulse width modulated differential signal pair.

8. The device of claim 7, further comprising:
an integrator in the feedback path.

9. A method of generating a control signal indicative of a common mode signal in first and second signals of a differential signal pair, the method comprising:
receiving a first signal at the inputs of each of a NAND gate and a NOR gate;
receiving a second signal at the inputs of each of the NAND gate and the NOR gate, wherein an output of the NAND gate is connected to a first terminal of a first capacitive element, and wherein an output of the NOR gate is connected to a first terminal of a second capacitive element;
outputting the control signal from a node coupled to second terminals of the first and second capacitive elements, the node also being coupled to a first terminal of a third capacitive element, a second terminal of the third capacitive element being coupled to a reference voltage; and
varying charge on the first and second capacitive elements dependent on the polarity of the first and second signals with respect to a threshold, wherein said varying charge on the first and second capacitive elements comprises
providing a first voltage level at the output of the NAND gate in response to both the first and second signals having a first polarity with respect to the threshold and otherwise providing a second voltage level at the output of the NAND gate; and
providing the second voltage level at the output of the NOR gate in response to both the first and second signals having a second polarity with respect to the threshold and otherwise providing the first voltage level at the output of the NOR gate.

10. An integrator comprising:
an apparatus for generating a pulse width modulated differential signal pair, comprising:
a device for generating a differential signal pair comprising:
a first signal path;
a second signal path; and
a common mode control circuit for generating a control signal indicative of a common mode signal in first and second signals of the differential signal pair, the common mode control circuit comprising:
a first control input for the first signal;
a second control input for the second signal;
a control output for the control signal;
a capacitive element comprising a first capacitive element, a second capacitive element and a third capacitive element;
a first charge controller for varying charge applied to the capacitive element dependent on polarity of the first and second signals with respect to a threshold, the first charge controller comprising:
a NAND gate having a first input coupled to the first control input, a second input coupled to the second control input, and an output coupled to a first terminal of the first capacitive element, a second terminal of the first capacitive element being coupled to the control output; and
a NOR gate having a first input coupled to the first control input, a second input coupled to the second control input, and an output coupled to a first terminal of the second capacitive element, a second terminal of the second capacitive element being coupled to the control output;
wherein the first charge controller is operable to maintain a direction of flow of the charge in response to the first and second signals both switching polarity simultaneously from polarities that are different in the first and second signals;
wherein a first terminal of the third capacitive element is coupled to the control output and a second terminal of the third capacitive element is coupled to a reference voltage;
wherein the common mode control circuit is coupled to the first signal path for receiving the first signal of the differential signal pair and to the second signal path for receiving the second signal of the differential pair; and wherein the integrator is operable to control the common mode signal in response to the control signal generated by the common mode control circuit.

* * * * *